(12) United States Patent
Ashkenazi

(10) Patent No.: US 7,653,368 B2
(45) Date of Patent: Jan. 26, 2010

(54) RADIO RECEIVER AND A METHOD THEREOF

(75) Inventor: Rony Ashkenazi, Kidron (IL)

(73) Assignee: Intel Corporation, Santa Clara, CA (US)

( * ) Notice: Subject to any disclaimer, the term of this patent is extended or adjusted under 35 U.S.C. 154(b) by 548 days.

(21) Appl. No.: 11/452,330

(22) Filed: Jun. 14, 2006

(65) Prior Publication Data

US 2007/0291880 A1 Dec. 20, 2007

(51) Int. Cl.
*H04B 1/26* (2006.01)

(52) U.S. Cl. .................... 455/234.1; 455/266

(58) Field of Classification Search ............ 455/234.1, 455/234.2, 239.1, 241.1, 241.2, 246.1, 251.1, 455/254, 266, 307; 344/343
See application file for complete search history.

(56) References Cited

U.S. PATENT DOCUMENTS

| 7,212,798 B1 * | 5/2007 | Adams et al. ............ 455/251.1 |
| 7,440,738 B2 * | 10/2008 | Zhang et al. ............ 455/234.1 |
| 2003/0091132 A1 | 5/2003 | Anderson |
| 2004/0097212 A1 | 5/2004 | Matsumoto et al. |
| 2004/0120249 A1 | 6/2004 | Blasco Claret et al. |
| 2004/0242174 A1 | 12/2004 | Kim et al. |
| 2004/0242177 A1 | 12/2004 | Yang |
| 2005/0239425 A1 | 10/2005 | Wallace et al. |
| 2006/0091948 A1 | 5/2006 | Darabi |
| 2007/0275686 A1 * | 11/2007 | Stevenson et al. ........ 455/234.1 |

OTHER PUBLICATIONS

International Search Report fo International Application PCT/US2007/070608, mailed on Dec. 12, 2007.
Fathat et al., "1-bit Sigma Delta Analog to Digital Converter For Multistandard GSM/UMTS Radio Receiver", Mediatron Laboratory—Ecole Supérieure de Communication (SUP'COM) 2088 Cité Technologique des Communication, Tunis, Tunisie, Ecole Nationale Supérieure des Télécommunications de Paris (ENST-Paris) 46 rue Barrault, 75634 Paris cedex, France, pp. 1-5.
Gomez et al., "A 1.5V 2.4/2.9mW 79.50dB DR ΣΔ Modulator for GSM/WCDMA in a 0.13 μm Digital Process", Texas Instruments Inc., USA, IEEE / ISSCC 2002 Visuals Supplement, pp. 242-243 and p. 490.

* cited by examiner

*Primary Examiner*—Thanh C Le
(74) *Attorney, Agent, or Firm*—Shiloh et al.

(57) ABSTRACT

Briefly, a radio receiver architecture and a method of measuring a power of a received signal to provide a first measurement, measuring a power of an assigned channel signal to provide a second measurement and adjusting a power of an input signal of an analog to digital converter according to a difference between the first and second power measurements.

21 Claims, 4 Drawing Sheets

RADIO RECEIVER AND A METHOD THEREOF

BACKGROUND OF THE INVENTION

Wideband Code Division Multiple Access (WCDMA) receiver may include a radio unit (RU) and a digital base band unit (DBBU). The RU may include, among other components, an analog filter and a sigma delta analog to digital converter (SD-ADC). The analog filter may be used as anti-aliasing filter (AAF) with limited channel selection capabilities.

The DBBU may include a decimation filter coupled to a matched filter and a power measurement unit to measure a power level of a signal at the output of the matched filter. An automatic gain controller (AGC) may receive the power measurement and may adjust a gain of amplifiers at the RU to achieve optimal signal spread at an input of the sigma-delta ADC.

More specifically, the measurement unit may measure an assigned channel power after the digital matched filter. This measurement may be compared to a predetermined power (e.g., a threshold). The AGC may compensate for the difference between the measurement of the assigned signal and the threshold, by sending a gain command to the amplifiers at the RU. As a result of the RU limited selectivity, high interferences from adjacent channels may be present at the ADC input. The power of these interferences is not reflected in the power measurement at the matched filter output and, thus the gain is not changed and the ADC input signal may be clipped.

Known radio receiver architectures may prevent the undesired effect described above by expanding the dynamic range of the SD-ADC and employing an AGC that leaves a headroom at an upper part of an amplitude of the input signal of the SD-ADC for adjacent channel interferences. However, the known radio receiver architectures may have at least two disadvantages. The first disadvantage may be that the radio receiver architecture requires a sigma delta ADC with a high dynamic range (e.g., ~70 dB). The second disadvantage may be that a desired signal is always spread over a lower part of the SD-ADC dynamic range where the signal may be more susceptible to implementation impairments.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
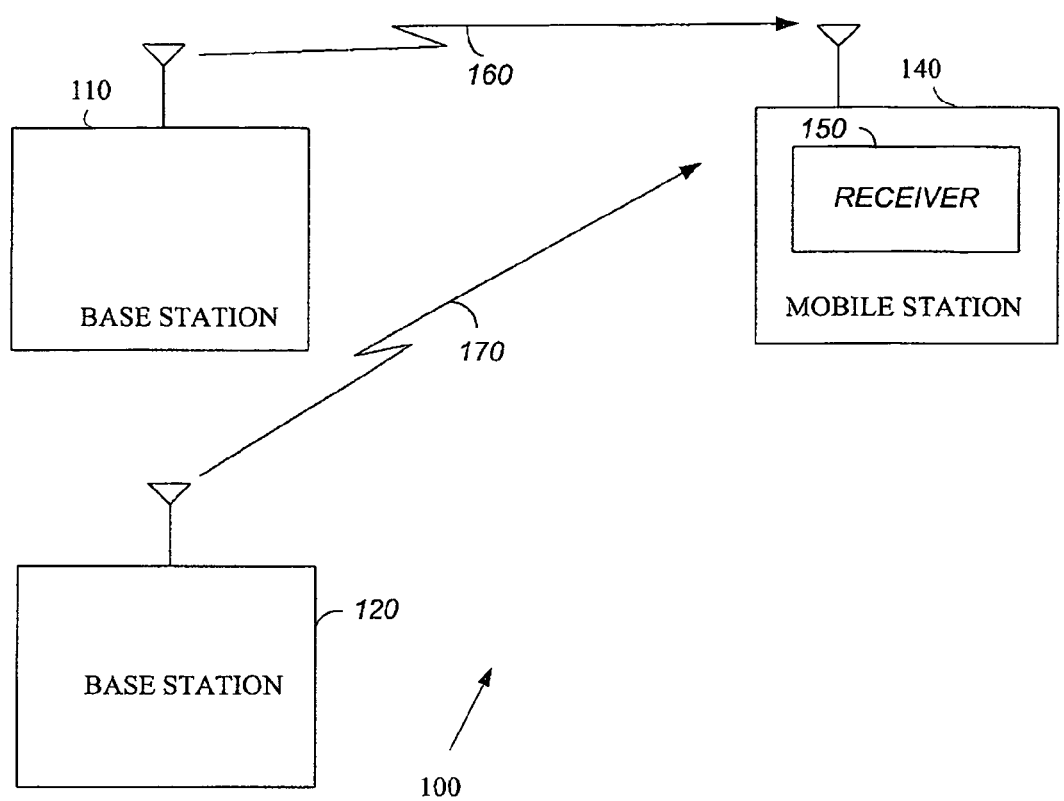
FIG. 1 is a schematic illustration of a wireless communication system according to an exemplary embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

It should be understood that the present invention may be used in a variety of applications. Although the present invention is not limited in this respect, the circuits and techniques disclosed herein may be used in many apparatuses such as transmitters of a radio system. Receivers intended to be included within the scope of the present invention include, by a way of example only, cellular radiotelephone receivers, two-way radio receivers, digital system receivers, wireless local area network receivers, wideband receivers, ultra wideband receivers, and the like.

Types of cellular radiotelephone receivers intended to be within the scope of the present invention may include, but are not limited to, Code Division Multiple Access (CDMA), CDMA-2000 and wide band CDMA (WCDMA) cellular radiotelephone receivers for receiving spread spectrum signals, receivers for global system for mobile communication (GSM), receivers for third generation cellular systems (3G), orthogonal frequency division multiplexing (OFDM) receivers, and the like.

Turning first to FIG. 1, a schematic illustration of a wireless communication system 100 according to an exemplary embodiment of the present invention is shown. Although the scope of the present invention is not limited to this example, wireless communication system 100 may be a WCDMA cellular radio telephony system. Wireless communication system 100 may include, at least, base stations 110 and at least one mobile station 140. The at least one mobile station 140 may include a receiver 150. Base station 110 may transmit over a wireless channel a signal 160 to mobile station 140. Base station 120 may transmit over a wireless channel a signal 170 to another mobile station (not shown) at an adjacent carrier frequency. Simultaneously transmissions signals 160 and 170 by base stations 110 and 120, respectively, may cause an adjacent channel interference at receiver 150 of mobile station 140.

According to embodiments of the present invention, signal 160 may include an assigned channel signal component and noise component. The noise component may include the adjacent channel interference, a thermal noise, a quantization noise or the like.

Figure 2:
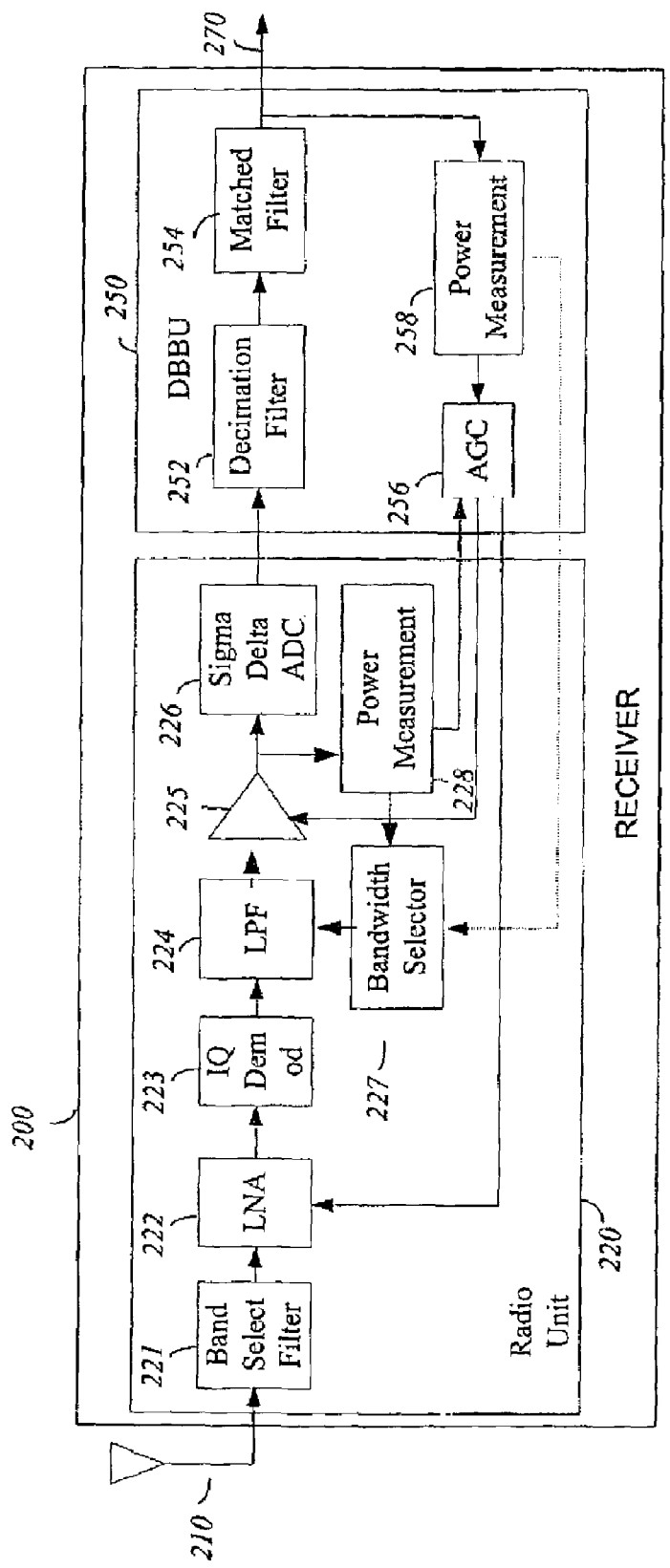
FIG. 2 is a schematic illustration of a block diagram of a receiver according to some embodiments of the present invention.

Turning to FIG. 2, a block diagram of a receiver 200 of mobile communication device (e.g., mobile station 140) according to some exemplary embodiment of the present invention is shown. Although the scope of the present invention is not limited in this respect, receiver 200 may include at least one antenna 210, a radio unit (RU) 220 and a digital base band unit (DBBU) 250.

According to this exemplary embodiment, RU 220 may include a band select filter 221, a low noise amplifier (LNA) 222, an In-phase/Quadrature (IQ) demodulator 223, a low pass filter 224, an amplifier 225, a sigma delta analog to digital (SD ADC) converter 226 and a power measurement unit 228. In some other exemplary embodiments of the present invention, receiver 220 may further include a bandwidth selector 227, although it should be understood that the scope of the present invention is not limited in this respect.

An exemplary embodiment of DBBU 250 may include a decimation filter 252, a matched filter 254, an automatic gain controller (AGC) 256 and a power measurement unit 258.

Although the scope of the present invention is not limited in this respect, types of antennas that may be used for antenna 210 may include an internal antenna, a dipole antenna, an omni-directional antenna, a monopole antenna, an end fed antenna, a circularly polarized antenna, a micro-strip antenna, a diversity antenna, and the like.

According to this exemplary embodiment antenna 210 may receive a signal via a wireless channel. The signal may include, at least, an assign channel signal and a noise. Band select filter 221 may filter at least some of the noise comments from the signal to provide a filtered signal. Band select filter 221 may be a SAW type filter, a bandpass filter or the like. LNA 222 may amplify the filtered signal and IQ demodulator 223 may demodulate the filter signal to provide, for example, In-Phase (I) and Quadrature (Q) demodulated signals. LPF 224 may filter other noise components from the I and Q demodulated signals to provide an IQ filtered signal. Amplifier 225 may be a gain variable amplifier. For example the gain of amplifier 225 may be controlled by AGC 256, if desired.

Amplifier 225 may amplify the IQ filtered signal and SD-ADC 226 may convert the IQ filtered signal into a digital base band signal. Decimation filter 252 and match filter 254 may filter and adjust channel interference from the digital base band signal to provide an assigned channel signal component 270, if desired. Measurement unit 258 may measure an output power of assigned channel signal component 270 and measurement unit 228 may measure the input power of the SD-ADC 226 input signal. Both measurement units 228 and 258 may provide power measurements to AGC 256. AGC 256 may adjust gains of LNA 222 and amplifier 225 according to the measurements of measurement units 228 and 258. In some embodiments of the invention, AGC 256 may adjust gains of LNA 222 and the amplifier 225 according to the measurements provided by measurement units 228 and 258 and/or according to a selectivity of LPF 224 and a dynamic range of SD-ADC 226, if desired. For example the dynamic range of SD-ADC 226 may be approximately 40 dB or any other suitable value.

More specifically, according to this exemplary embodiment of the present invention, AGC 256 may control the power of the input signal of SD-ADC 226. For example, AGC 256 may set an input power of SD-ADC 226 to a predetermined input power, if desired. Setting the input power to the predetermined power may prevent clipping of the SD-ADC independently of the adjacent channels interference power.

According to embodiments of the invention, matched filter 254 may attenuate the adjacent channels interference to negligible levels, if desired. However, assigned channel signal component 270 may include an in-band noise, which may be a composite of the thermal noise, quantization noise and any external noise.

According to another embodiment of the present invention, for example, in a receiver (e.g., receiver 200) configured to operate according to the WCDMA standard, bandwidth selector 227 may set a desired bandwidth to LPF 224 according to a power ratio of a composite power, which includes also the adjacent channels power, to an in-band channel. According to this example, when the power ratio is high, the bandwidth of LPF 224 may be decreased.

According to this embodiment of the present invention, the presence of an adjacent channel interference at the input of SD-ADC 226 may be identified by occasionally selecting a wide LPF bandwidth and measuring the power difference between the input power of SD-ADC 226 and the output power of matched filter 254. If the SD-ADC 226 input power is higher than the matched filter 254 output power then band selector 227 may set LPF 224 to a narrower bandwidth. If the SD-ADC 226 input power is equal and/or even to the matched filter 254 output power, then band selector 227 may set a wide bandwidth to LPF 224, although the scope of this exemplary embodiment of the invention is not limited in this respect.

According to another embodiment of the invention, only measurements of power measurement unit 258 may be used by bandwidth selector 227 to select the bandwidth of LPF 224, if desired.

An example of parameters settings for WCDMA receiver is presented in Table 1 below. According to Table 1, LPF 226 may be a $3^{rd}$ Butterworth LPF and SD-ADC 226 may be a $3^{rd}$ order sigma-delta converter that operates at a rate of 30.72 MHz, if desired. The values as presented in Table 1 are based on an ideal LPF and an ideal SD-ADC. It is also assumed that, in all the receiver characteristics tests, the noise figure (NF) does not exceed the level required for a sensitivity test, e.g., NF<9 dB. The SD-ADC dynamic range (DR), in the above example, is a common selection for demodulation of a desired high speed data channel without the presence of adjacent channel interferences. This means that in this design the DR may not be increased to support the presence of adjacent channels beyond a level required for demodulation of the desired channel.

TABLE 1

| Parameter | | Value |
|---|---|---|
| LPF | Type | Butterworth |
| | Order | 3 |
| | Bandwidth [MHz] | 2.5 |
| 1 bit Sigma-Delta Converter | Over-Sampling | 8 |
| | Sampling Frequency [MHz] | 30.72 |
| | Order | 3 |
| Dynamic Range [dB] | | 45 |
| Radio Unit Transparency measured by Error Vector Magnitude (EVM) [dBc] | | −28 |
| Adjacent Channel Selectivity (ACS) - margins to standard requirements [dB] | | >10 |
| 10 MHz wideband blocker - margins to standard requirements [dB] | | >10 |
| 10 MHz wideband blocker - margins to standard requirements [dB] | | >10 |
| 2.7 MHz narrowband blocker - margins to standard requirements [dB] | | >3 |
| 2.8 MHz narrowband blocker - margins to standard requirements [dB] | | >3 |
| Attenuation of folded signal due to sampling [dB] | | 65 |

Figure 3:
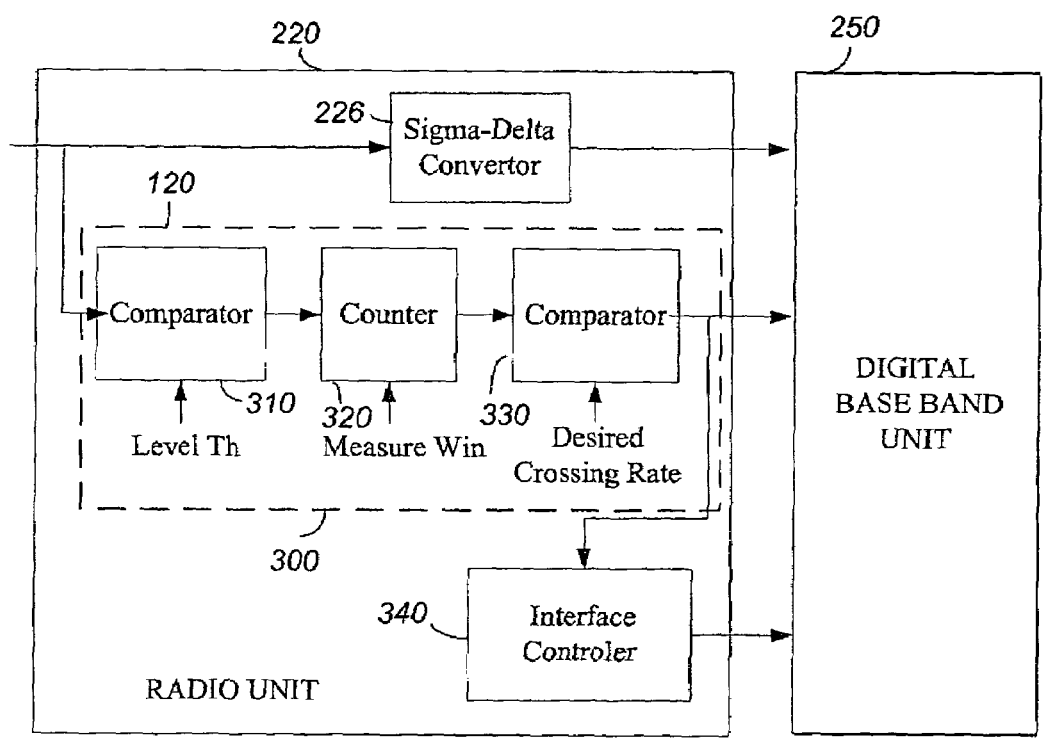
FIG. 3 is a schematic illustration of a block diagram of a power measurement unit according to one embodiment of the present invention.

Turning to FIG. 3, a schematic illustration of a block diagram of a power measurement unit 300 according to one embodiment of the present invention is shown. Power measurement unit 300 may include a comparator 310, a counter 320 and a comparator 330.

According to exemplary embodiments of the invention, power measuring unit 300 may measure the power of the input signal of SD-ADC 226 by using level crossing rate measurement over a predetermined time interval. Comparator 310 may compare the input signal of SD-ADC 226 to a predetermined threshold level. Counter 320 may count power level crossing over a predetermined time interval and comparator 330 may compare the number of power level crossings to a desired power level rate crossing threshold.

According to some embodiments of the present invention, the power rate crossing may be indicative of the power level of the input signal of the SD-ADC 226. This power measurement may be transferred directly to DBBU 250. Power measurement unit 300 may provide an indication of who much of a given rate already passed to AGC 256, if desired.

According to some other exemplary embodiments of the invention, the power measurement of power measurement unit 300 may be transferred to the DBB 250 using a serial control interface 340. In other optional embodiments of the invention, the power measurement of power measurement unit 300 may be transferred to the DBB 250 by embedding the measurement to a data interface (not shown) or by a dedicated interface pin, if desired. For example, the use of low dynamic range SD-ADC may enable the use of a conventional single ended interface that operates at a relatively low rate (e.g. less than 50 MHz). The low rate interface may reduce interface power consumption, although the scope of the present invention is not limited to this exemplary embodiment of the invention.

Figure 4:
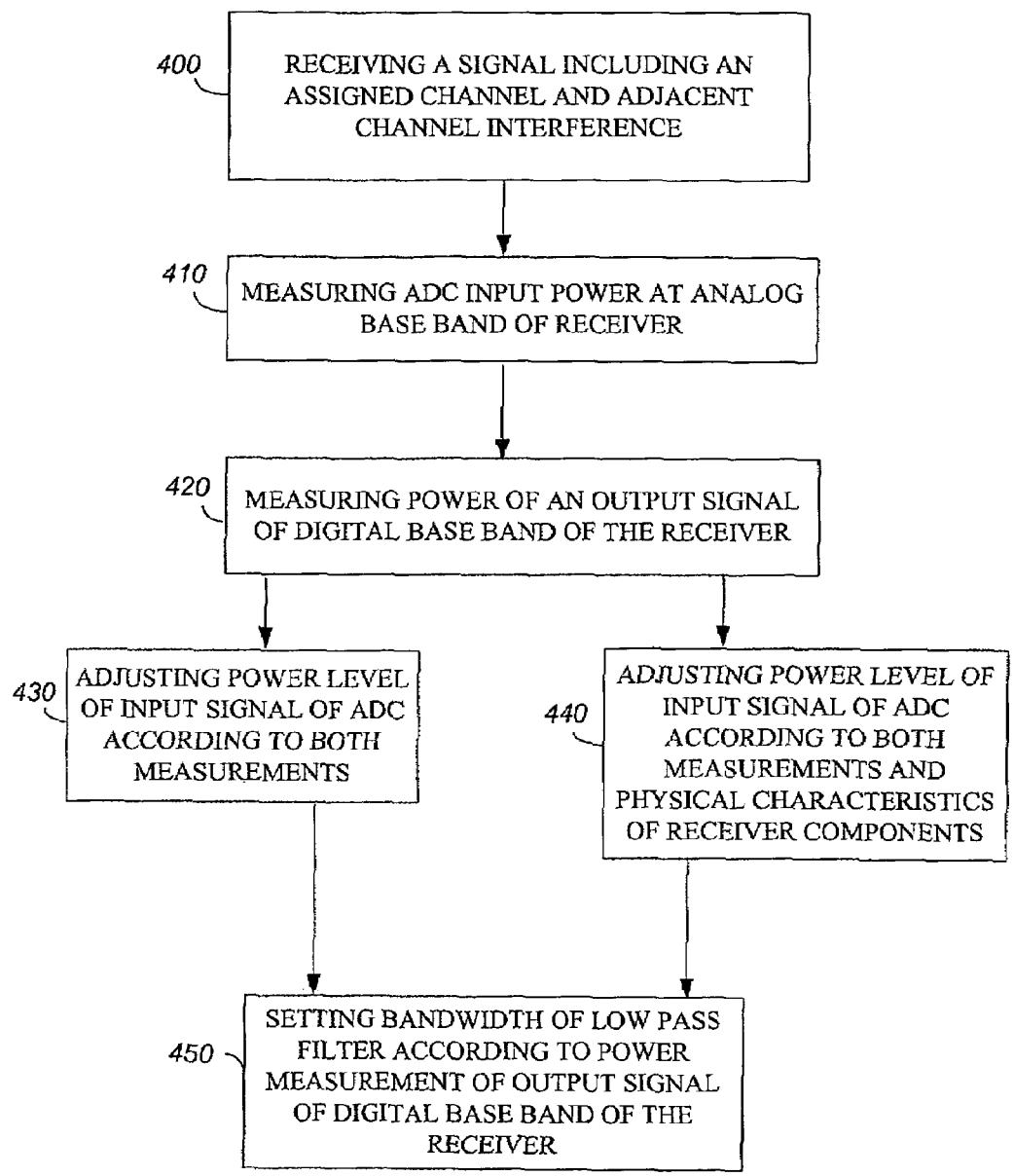
FIG. 4 is a flowchart of a method to adjust a power level of an input signal of an analog to digital converter according to exemplary embodiments of the invention.

Turning to FIG. 4, a flowchart of a method to adjust a power level of an input signal of an analog to digital converter according to exemplary embodiments of the invention is shown. According to some exemplary embodiments of the invention, a receiver (e.g. receiver 200) may receive a signal which includes at least an assigned channel and an adjacent channel interference (text block 400). In order to reduce at least a portion of the adjacent channel interference, two power measurements may be performed. A first power measurement may be done at an input of an ADC of a radio unit of the receiver (text block 410) and a second power measurement of an output signal may be done at a digital base band unit of the receiver (text block 420).

Although the scope of the present invention is not limited to this method, the measurements may be used to adjust the power of the ADC input signal (text block 430) or, alternatively, to adjust the power of the ADC input signal according to both measurements and physical characteristics of the receiver components (text block 440). For example, the physical characteristics may be a dynamic range of the ADC, a sampling frequency of the ADC, noise shape parameters of a SD-ADC, a bandwidth of a filter, a gain of an amplifier, a noise, or the like.

According to some other embodiments of the invention, in order to reduce noise from the input signal, a bandwidth of a filter may be set according to power measurements of the output signal of the digital baseband unit (text block 450).

While certain features of the invention have been illustrated and described herein, many modifications, substitutions, changes, and equivalents will now occur to those skilled in the art. It is, therefore, to be understood that the appended claims are intended to cover all such modifications, substitutions, changes, and equivalents as may fall within the true spirit of the invention.

What is claimed is:

1. A radio receiver comprising:
   a radio unit including:
      a filter;
      a bandwidth selector to select a bandwidth of the filter;
      a receiver amplifier operably coupled to an output of the filter; and
      a first power measurement unit to provide a first measurement of a power of a received signal at an output of the receiver amplifier; and
   a digital baseband unit including:
      a second power measurement unit to provide a second measurement of at least a power of an assigned channel signal component of the received signal; and
      an automatic gain controller to adjust a gain of the receiver amplifier according to the first and second measurements,
      wherein the bandwidth selector is to select the bandwidth of the filter based on a comparison between the first and second measurements.

2. The radio receiver of claim 1, comprising:
   an analog to digital converter having an input operably coupled to an output of the receiver amplifier, wherein the first power measurement unit measures the power of the received signal at the input of the analog to digital converter.

3. The radio receiver of claim 2, comprising:
   a low noise amplifier operably coupled to an input of the filter, wherein the automatic gain controller is able to adjust a gain of the low noise amplifier and the receiver amplifier according to a selectivity of the filter and a dynamic range of the analog to digital converter.

4. The radio receiver of claim 2, wherein the analog to digital converter comprises a sigma delta analog to digital converter.

5. The radio receiver of claim 2, wherein the digital baseband unit includes:
   a decimation filter operably coupled to an output of the analog to digital converter, and a matched filter operably coupled to an output of the decimation filter, wherein the second power measurement unit is to measure the second measurement at an output of the matched filter.

6. The radio receiver of claim 1, wherein the band selector is to set the bandwidth of the filter to a first bandwidth, if the first measurement is greater than the second measurement; and to set the bandwidth of the filter to a second bandwidth, wider than the first bandwidth, if the first measurement is equal to or lesser than the second measurement.

7. A method comprising:
   filtering a received wireless signal, using a filter, to provide a filtered received signal;
   amplifying the filtered received signal using a receiver amplifier;
   measuring a power of the filtered received signal to provide a first measurement;
   measuring a power of an assigned channel signal component to provide a second measurement;
   adjusting a gain of the receiver amplifier based the first and second power measurements; and
   setting a bandwidth of the filter based on a comparison between the first and second power measurements.

8. The method of claim 7 comprising:
   converting an amplified signal output from the receiver amplifier into a digital signal using an analog to digital converter; and
   adjusting the gain of the receiver amplifier and a gain of a low noise amplifier operably coupled to an input of the filter according to a selectivity of the filter and a dynamic range of the analog to digital converter.

9. The method of claim 8, wherein the analog to digital converter comprises a sigma delta analog to digital converter.

10. The method of claim 7, comprising setting the bandwidth of the filter to a first bandwidth, if the first measurement is greater than the second measurement; and setting the bandwidth of the filter to a second bandwidth, wider than the first bandwidth, if the first measurement is equal to or lesser than the second measurement.

11. A wireless communication device comprising:
a dipole antenna to receive a received signal;
a radio unit including:
a filter;
a bandwidth selector to select a bandwidth of the filter;
a receiver amplifier operably coupled to an output of the filter; and
a first power measurement unit to provide a first measurement of a power of the received signal at an output of the receiver amplifier; and
a digital baseband unit including:
a second power measurement unit to provide a second measurement of at least a power of an assigned channel signal component of the received signal; and
an automatic gain controller to adjust a gain of the receiver amplifier according to the first and second measurements,
wherein the bandwidth selector is to select the bandwidth of the filter based on a comparison between the first and second measurements.

12. The wireless communication device of claim 11, comprising:
an analog to digital converter having an input operably coupled to an output of the receiver amplifier, wherein the first power measurement unit measures the power of the received signal at the input of the analog to digital converter.

13. The wireless communication device of claim 12, comprising:
a low noise amplifier operably coupled to an input of the filter, wherein the automatic gain controller is able to adjust a gain of the low noise amplifier and the receiver amplifier according to a selectivity of the filter and a dynamic range of the analog to digital converter.

14. The wireless communication device of claim 12, wherein the analog to digital converter comprises a sigma delta analog to digital converter.

15. The wireless communication device of claim 11, wherein the band selector is to set the bandwidth of the filter to a first bandwidth, if the first measurement is greater than the second measurement; and to set the bandwidth of the filter to a second bandwidth, wider than the first bandwidth, if the first measurement is equal to or lesser than the second measurement.

16. A wireless communication system comprising:
a mobile station able to receive a first signal from a first base station that includes an assigned channel signal component and a second signal from a second base station that causes interference at the first signal, wherein the mobile station comprises:
a radio unit including:
a filter;
a bandwidth selector to select a bandwidth of the filter;
a receiver amplifier operably coupled to an output of the filter; and
a first power measurement unit to provide a first measurement of a power of the first signal at an output of the receiver amplifier; and
a digital baseband unit including:
a second power measurement unit to provide a second measurement of at least a power of the assigned channel signal component of the first signal; and
an automatic gain controller to adjust a gain of the receiver amplifier according to the first and second measurements,
wherein the bandwidth selector is to select the bandwidth of the filter based on a comparison between the first and second measurements.

17. The wireless communication system of claim 16, comprising:
an analog to digital converter having an input operably coupled to an output of the receiver amplifier, wherein the first power measurement unit measures the power of the received signal at the input of the analog to digital converter.

18. The wireless communication system of claim 17, comprising:
a low noise amplifier operably coupled to an input of the filter, wherein the automatic gain controller is able to adjust a gain of the low noise amplifier and the receiver amplifier according to a selectivity of the filter and a dynamic range of the analog to digital converter.

19. The wireless communication system of claim 17, wherein the analog to digital converter comprises a sigma delta analog to digital converter.

20. The wireless communication system of claim 16, wherein the band selector is to set the bandwidth of the filter to a first bandwidth, if the first measurement is greater than the second measurement; and to set the bandwidth of the filter to a second bandwidth, wider than the first bandwidth, if the first measurement is equal to or lesser than the second measurement.

21. The wireless communication system of claim 16, wherein the first power measuring unit is able to measure the power of the first signal by using level crossing rate measurement over a predetermined time interval.

* * * * *

UNITED STATES PATENT AND TRADEMARK OFFICE
CERTIFICATE OF CORRECTION

| | |
|---|---|
| PATENT NO. | : 7,653,368 B2 |
| APPLICATION NO. | : 11/452330 |
| DATED | : January 26, 2010 |
| INVENTOR(S) | : Rony Ashkenazi et al. |

It is certified that error appears in the above-identified patent and that said Letters Patent is hereby corrected as shown below:

On the face page, under "Other Publication" in column 2, line 1, delete "fo" and insert -- of --, therefor.

In column 6, line 51, in Claim 7, after "based" insert -- on --.

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

PATENT NO.      : 7,653,368 B2                                             Page 1 of 1
APPLICATION NO. : 11/452330
DATED           : January 26, 2010
INVENTOR(S)     : Rony Ashkenazi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 774 days.

Signed and Sealed this

Twenty-eighth Day of December, 2010

David J. Kappos
*Director of the United States Patent and Trademark Office*